(12) United States Patent
Sugawara

(10) Patent No.: US 7,289,367 B2
(45) Date of Patent: Oct. 30, 2007

(54) SEMICONDUCTOR MEMORY DEVICE CAPABLE OF CARRYING OUT STABLE OPERATION

(75) Inventor: Hiroshi Sugawara, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/101,410

(22) Filed: Apr. 8, 2005

(65) Prior Publication Data

US 2005/0226086 A1   Oct. 13, 2005

(30) Foreign Application Priority Data

Apr. 9, 2004   (JP) .............................. 2004-116049

(51) Int. Cl.
   G11C 11/34   (2006.01)
   G11C 16/06   (2006.01)
   G11C 7/00    (2006.01)
   G11C 8/18    (2006.01)

(52) U.S. Cl. .......................... 365/185.23; 365/230.06; 365/189.11; 365/233.5

(58) Field of Classification Search ........... 365/230.03, 365/230.06, 185.11, 185.23, 185.13
See application file for complete search history.

(56) References Cited

U.S. PATENT DOCUMENTS

| | | | | |
|---|---|---|---|---|
| 5,511,026 | A * | 4/1996 | Cleveland et al. ..... | 365/189.09 |
| 6,233,198 | B1 * | 5/2001 | Choi ..................... | 365/230.06 |
| 6,421,295 | B1 * | 7/2002 | Mao et al. ............. | 365/230.06 |
| 6,433,583 | B1 | 8/2002 | Micheloni et al. | |
| 6,646,950 | B2 * | 11/2003 | Akaogi ................. | 365/230.06 |
| 6,804,161 | B2 * | 10/2004 | Mizugaki ............... | 365/230.03 |
| 2006/0104131 | A1 * | 5/2006 | Sugawara et al. ..... | 365/189.09 |

* cited by examiner

*Primary Examiner*—Amir Zarabian
*Assistant Examiner*—Michael Weinberg
(74) *Attorney, Agent, or Firm*—Foley & Lardner LLP

(57) ABSTRACT

A semiconductor memory device includes a word drive line, and a word line connected with memory cells. A first drive circuit drives the word drive line to a first voltage based on a main word signal, and resets the word drive line to a ground voltage in a time period for transition of an address signal. A second drive circuit outputs a signal of the first voltage to the word line based on a sub-word signal such that a data is read out from one of the memory cells. The main word signal and the sub-word signal are obtained from an address signal, and are signals taking the ground voltage or a second voltage which is lower than the first voltage.

18 Claims, 5 Drawing Sheets

SEMICONDUCTOR MEMORY DEVICE CAPABLE OF CARRYING OUT STABLE OPERATION

BACKGROUND OF THE INVENTION

1. Field of the Invention

The present invention relates to a semiconductor memory device, and more particularly to a decoding technique of a semiconductor memory device.

2. Description of the Related Art

In recent years, the information technology (IT) has considerably progressed, and a data processing apparatus can carry out very complex processing of a large amount of data in a very short time. In accompaniment by this, a semiconductor memory device is made to have a large scale, so that the number of bits of an address is increased. Thus, a hierarchical decoding operation is necessitated. Also, the semiconductor memory device is required to operate in a low power supply voltage for reduction of power consumption. On the other hand, an electrically rewritable non-volatile memory as a flash memory, which can store data for a long time, is often used for recording a control program of an electronic apparatus. The flash memory requires a higher voltage than a normal power supply voltage for rewriting a data. As a consequence, the flash memory internally handles a plurality of kinds of voltages of relatively high and relative low voltages. Therefore, it is necessary to balance a circuit handling the relatively high voltage and a circuit handling the relatively low voltage in the operation speed and the voltage.

In U.S. Pat. No. 6,433,583, a CMOS switch circuit of a high voltage transition type, more specifically, a decoder circuit for a non-volatile memory is disclosed. In the CMOS switch circuit, a signal on the output side is fed back to the input side, to restrict a switching current so that power consumption is reduced.

SUMMARY OF THE INVENTION

In an aspect of the present invention, a semiconductor memory device includes a word drive line, and a word line connected with memory cells. A first drive circuit drives the word drive line to a first voltage based on a main word signal, and resets the word drive line to a ground voltage in a time period for transition of an address signal. A second drive circuit outputs a signal of the first voltage to the word line based on a sub-word signal such that a data is read out from one of the memory cells. The main word signal and the sub-word signal are obtained from an address signal, and are signals taking the ground voltage or a second voltage which is lower than the first voltage.

Here, the semiconductor memory device may further include an address transition detector configured to detect transition of the address signal; and a control circuit configured to generate an active reset control signal during the time period for the transition of the address signal. The first drive circuit resets the word drive line to the ground voltage in response to the active reset control signal.

Also, the first drive circuit may include a level shift circuit configured to invert and level-shift the main word signal to output the first voltage signal onto the word drive line; and a reset circuit connected in parallel to the level shift circuit to reset the word drive line to the ground voltage in response to the active reset control signal.

Also, the semiconductor memory device may further include a global row decoder configured to decode a part of the address to generate the main word signal while the reset control signal is inactive; and a local row decoder configured to decode another part of the address to generate the sub-word signal while the reset control signal is inactive.

Also, the semiconductor memory device may further include a boosting circuit configured to boost the second voltage to the first voltage while the reset control signal is inactive.

Also, the semiconductor memory device may further include a boosting circuit configured to boost the second voltage to the first voltage.

Also, the level shift circuit may include a first P-channel transistor having a source connected with the first voltage, a gate connected with the word drive line, and a drain; a second P-channel transistor having a source connected with the first voltage, a gate connected to the drain of the first P-channel transistor and a drain connected with the word drive line and the gate of the first P-channel transistor; a first N-channel transistor having a drain connected with the drain of the first P-channel transistor, a gate connected with the second voltage, and a source connected with the main word signal; and a second N-channel transistor having a drain connected with the drain of the second P-channel transistor, a gate connected with the main word signal, and a source connected with the ground voltage. The reset circuit may include a N-channel reset transistor having a drain connected with the word drive line, a gate connected with the reset control signal, and a source connected to the ground voltage.

Also, the second drive circuit may include a third P-channel transistor having a source connected with the word drive line, a gate connected to the sub-word signal; a third N-channel transistor having a drain connected with a drain of the third P-channel transistor, a gate connected to the reset control signal and a source connected to the ground voltage; and a fourth N-channel transistor having a drain connected with the drain of the third P-channel transistor, a gate connected to the main word signal and a source connected to the ground voltage.

Also, another aspect of the present invention, a method of reading a data from a memory cell in a semiconductor memory device, is achieved by activating a main word signal; by activating a sub-word signal; by driving a word drive line to a first voltage based on the activated main word signal; by outputting a signal of the first voltage to a word line based on the activated sub-word signal such that the data is read out from the memory cell; and by resetting the word drive line to a ground voltage in a time period for transition of an address signal. The main word signal and the sub-word signal are obtained from an address signal, and are signals taking the ground voltage or a second voltage which is lower than the first voltage.

Also, the method may be achieved by further detecting transition of the address signal; and generating an active reset control signal during the time period for the transition of the address signal. The resetting may be achieved by resetting the word drive line to the ground voltage in response to the active reset control signal.

Also, the method may be achieved by inverting and level-shifting the activated main word signal to output the first voltage signal onto the word drive line.

Also, the method may be achieved by decoding a part of the address to generate the main word signal while the reset control signal is inactive; and by decoding another part of the address to generate the sub-word signal while the reset control signal is inactive.

Also, the method may be achieved by further boosting the second voltage to the first voltage while the reset control signal is inactive.

Also, the method may be achieved by further boosting the second voltage to the first voltage.

Also, the resetting may be achieved by resetting the word drive line to the ground voltage in response to the active reset control signal by applying the active reset control signal to a gate of a N-channel reset transistor.

DESCRIPTION OF THE PREFERRED EMBODIMENTS

Hereinafter, a semiconductor memory device of the present invention such as a flash memory will be described in detail with reference to the attached drawings. In the following description, a read operation of data stored in a memory cell of the flash memory will be described. In the semiconductor memory device such as the flash memory, an external operation voltage of an input/output circuit is often different from that of an internal circuit. That is to say, the input/output circuit operates in a Vcc voltage level of a voltage range from 0 V to 3.3 V. On the other hand, a decoder to drive a memory cell operates in a voltage of a range from 0 V to 6 V. Thus, an internal boosting circuit is necessary to generate a power supply voltage for the internal circuit. In the present invention, two kinds of voltage levels, namely, the Vcc voltage level and a readout voltage level are used.

Figure 1:
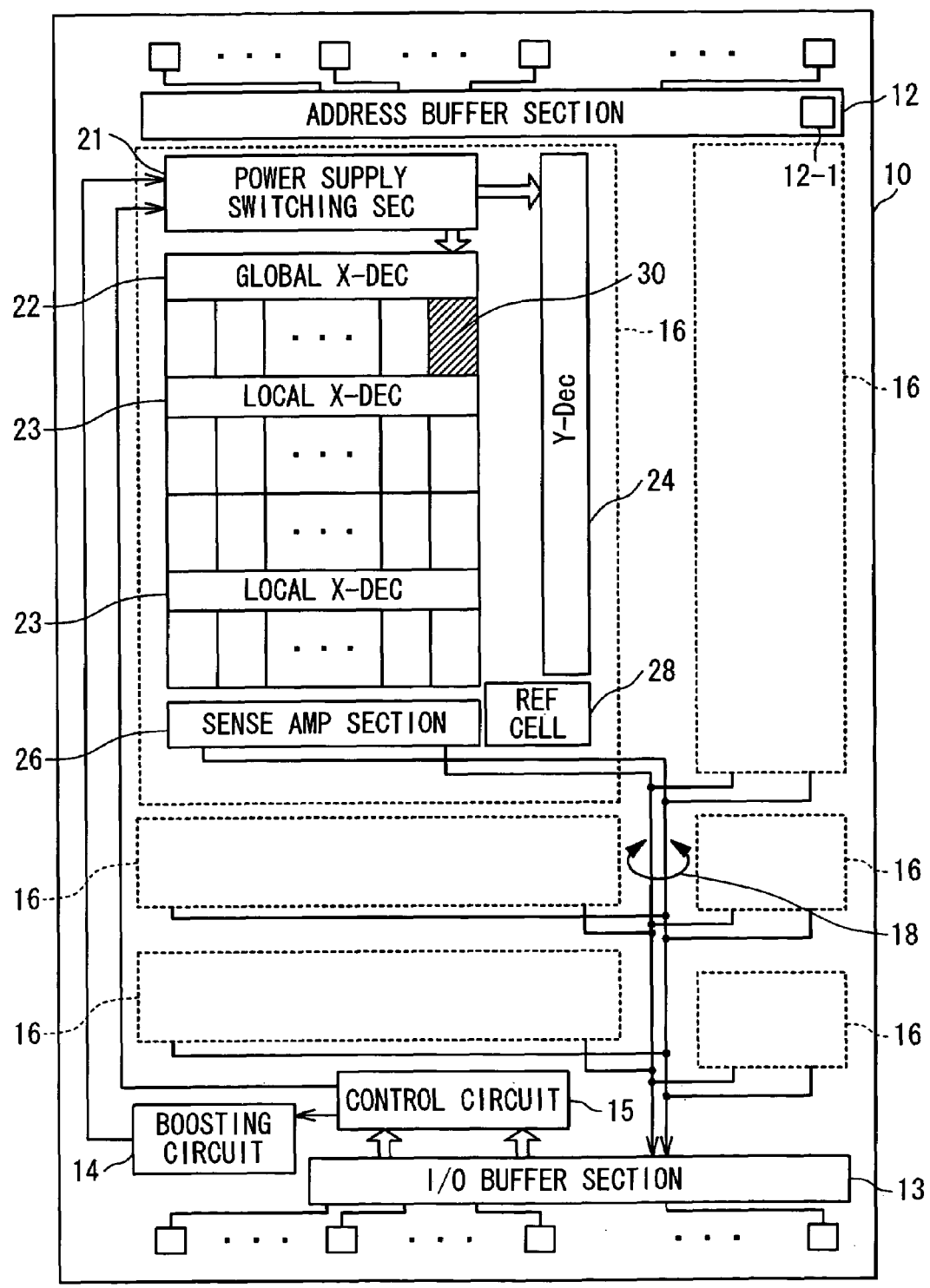
FIG. 1 is a schematic block diagram showing a hardware configuration of a flash memory according to of the present invention.

FIG. 1 is a block diagram schematically showing a hardware structure of a flash memory 10 to describe the semiconductor memory device of the present invention. The flash memory 10 is provided with an address buffer section 12, a plurality of plates 16, an output bus 18, an input/output buffer section 13, a control circuit 15, and a boosting circuit 14. The plurality of plates 16 are arranged in the flash memory 10. Each of the plates 16 is a unit function block of the flash memory 10. The plate 16 is provided with a sector 30, a global row decoder section 22, local row decoder sections 23, a column decoder section 24, a sense amplifier section 26, a reference cell section 28, and a power supply switching section 21.

An address is supplied to the address buffer section 12 of the flash memory 10 from an external device. The address buffer section 12 level-shifts the signal level of the supplied address to the signal level of an internal circuit of this flash memory 10 and outputs as an address signal. The address signal is outputted from the address buffer section 12 to each of the plates 16. Each plate 16 outputs a stored data as a data output signal in response to the address signal. The data output signals outputted from the respective plates 16 are collected onto the output bus 18, and the collected data output signals are supplied to the input/output buffer section 13. The input/output buffer section 13 level-shifts the signal levels of the supplied data output signals to an external signal level, and then outputs as a memory output data from the flash memory 10. The control circuit 15 receives a control data from the input/output buffer section 13. The control circuit 15 determines an operation of the flash memory 10 based on the control data, and then outputs control signals. The control circuit 15 supplies the control signals to the boosting circuit 14 and the respective plates 16 to control the flash memory 10. The boosting circuit 14 supplies boosted power supply voltages to the respective plates 16 through the power supply switching section 21.

The address signal to be supplied to the plate 16 is distributed to the global row decoder section 22, the local row decoder sections 23, and the column decoder section 24. A row address of the address signal is decoded by the global row decoder section 22 and the local row decoder sections 23, so that a word line connected with a memory cell is selected. A bit line of the memory cell is selected by the column decoder section 24 based on a column address of the address signal. A data is read out from the memory cell, which is designated, by the selected word line and the selected bit line. Otherwise, data is written to the memory cell, which is designated, by the selected word line and the selected bit line. The data read out from the memory cell is compared in voltage with data read out from the reference cell section 28 by the sense amplifier section 26. The sense amplifier section 26 outputs the comparison result as the data output signal. It should be noted that the sector 30 is a minimum unit which is used to erase data stored in memory cells of the sector 30, and the sector 30 are designated by a plurality of word lines.

Figure 2:
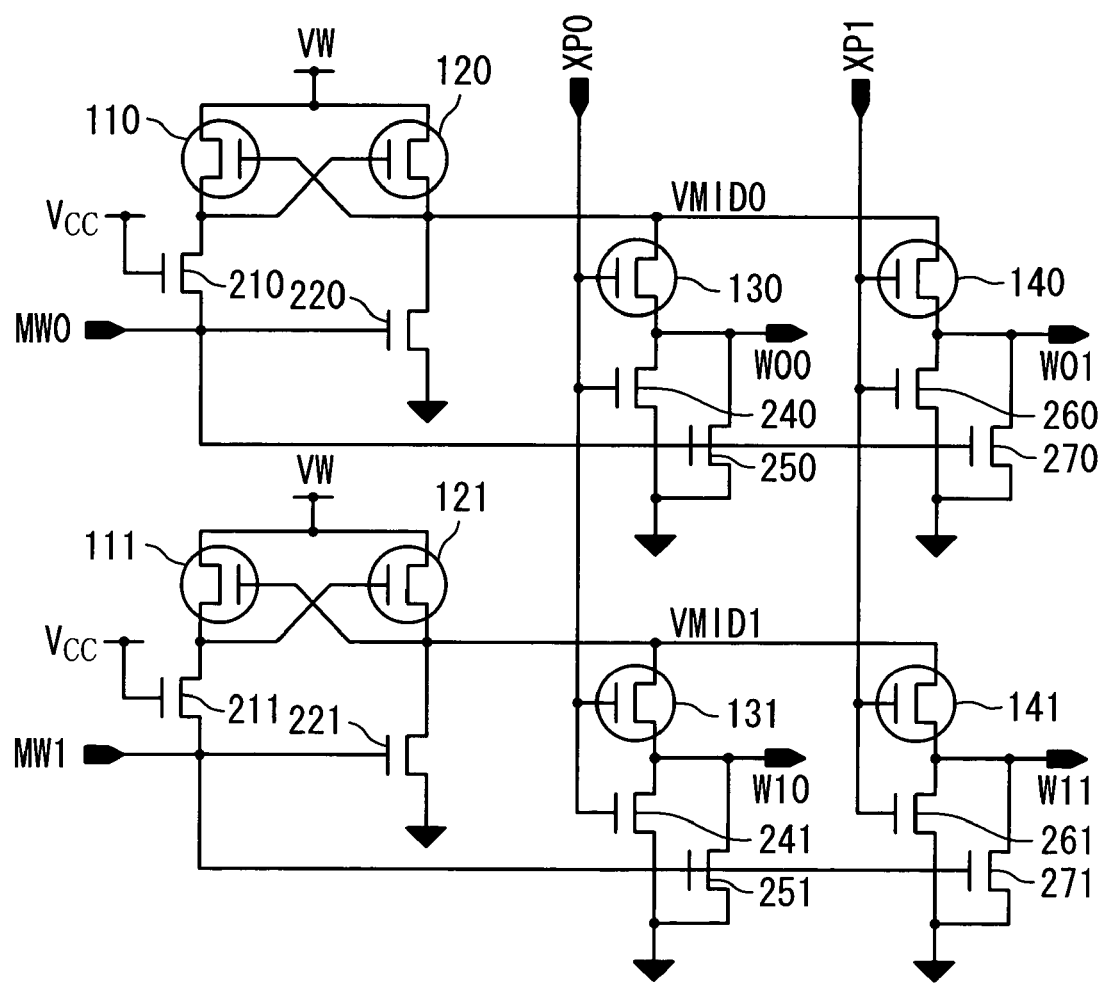
FIG. 2 is a circuit diagram showing a portion of an internal decoder section in the flash memory to describe the present invention.

FIG. 2 is a circuit diagram showing a portion of a decoder section in which one of word lines W00, W01, W10 and W11 is selected based on main word line signals on main word lines MW0 and MW1 outputted from the global row decoder section 22 and sub-word line signals on sub-word lines XP0 and XP1 outputted from the local row decoder section 23.

In FIG. 2, a circuit portion corresponding to the main word line MWn is provided with P-channel transistors $11n$, $12n$, $13n$, and $14n$ (n is 0 or 1), and N-channel transistors $21n$, $22n$, $24n$, $25n$, $26n$, and $27n$. That is, a circuit portion corresponding to a main word line MW0 is provided with the P-channel transistors 110, 120, 130, and 140 and N-channel transistors 210, 220, 240, 250, 260, and 270, whereas a circuit portion corresponding to a main word line MW1 is provided with P-channel transistors 111, 121, 131, and 141; and N-channel transistors 211, 221, 241, 251, 261, and 271. The main word line MW0 is connected to a source of the N-channel transistor 210, and gates of the N-channel transistors 220, 250, and 270. A gate of the N-channel transistor 210 is connected to a power supply voltage Vcc, and a drain of the N-channel transistor 210 is connected to a drain of the P-channel transistor 110 and a gate of the P-channel transistor 120. A source of the N-channel transistor 220 is grounded, and a drain thereof is connected to a drain of the P-channel transistor 120 and a gate of the P-channel transistor 110. A drain of the P-channel transistor 110 is connected to the gate of the P-channel transistor 120, and the drain of the P-channel transistor 120 is connected to the gate of the P-channel transistor 110. Both of the source of the P-channel transistor 110 and the source of the P-channel transistor 120 are connected to a power supply voltage VW supplied from the boosting circuit 14 through the power supply switching section 21. The drain of the P-channel transistor 120 is connected to sources of the P-channel transistors 130 and 140. This node between the drain of the P-channel transistor 120 and the drain of the N-channel transistor 220 is a word drive line VMID0. The sub-word line XP0 is connected to a gate of the P-channel transistor 130 and a gate of the N-channel transistor 240. A drain of the P-channel transistor 130 is connected to drains of the N-channel transistors 240 and 250, which are connected to memory cells as a word line W00. Both sources of the N-channel transistors 240 and 250 are grounded. The sub-word line XP1 is connected to a gate of the P-channel transistor 140, and also, a gate of the N-channel transistor 260. A drain of the P-channel transistor 140 is connected to drains of the N-channel transistors 260 and 270, which are connected to memory cells as a word line W01. Both sources of the N-channel transistors 260 and 270 are grounded.

Similarly, the main word line MW1 is connected to a source of the N-channel transistor 211, and gates of the N-channel transistors 221, 251, and 271. A gate of the N-channel transistor 211 is connected to the power supply VC, and a drain of the N-channel transistor 211 is connected to both a drain of the P-channel transistor 111 and a gate of the P-channel transistor 121. A source of the N-channel transistor 221 is grounded, and a drain thereof is connected to a drain of the P-channel transistor 121 and a gate of the P-channel transistor 111. A drain of the P-channel transistor 111 is connected to the gate of the P-channel transistor 121, and the drain of the P-channel transistor 121 is connected to the gate of the P-channel transistor 111. Both the source of the P-channel transistor 111 and the source of the P-channel transistor 121 are connected to the power supply VW. The drain of the P-channel transistor 121 is connected to sources of the P-channel transistors 131 and 141. This node is a word drive line VMID1. The sub-word line XP0 is connected to a gate of the P-channel transistor 131 and a gate of the N-channel transistor 241. A drain of the P-channel transistor 131 is connected to drains of the N-channel transistors 241 and 251, which are connected to memory cells as a word line W10. Both sources of the N-channel transistors 241 and 251 are grounded. The sub-word line XP1 is connected to a gate of the P-channel transistor 141, and also, a gate of the N-channel transistor 261. A drain of the P-channel transistor 141 is connected to drains of the N-channel transistors 261 and 271, which are connected to memory cells as a word line W11. Both sources of the N-channel transistors 261 and 271 are grounded.

The P-channel transistors 110 and 120 and the N-channel transistors 210 and 220 is a level shift circuit which functions as a main word driver operable in response to the main word line MW0. The P-channel transistors 111 and 121 and the N-channel transistors 211 and 221 is a level shift circuit which functions as a main word driver in response to the main word line MW1. Each level shift circuit converts the main word line signal having the Vcc voltage level (for instance, the voltage range from 0 V to 3.3 V) into a word line signal having a read-out drive level (for example, the voltage range from 0 V to 6 V). Then, the level shift circuit supplies the level-shifted word line signal to a sub-word driver. When the main word line signal MW0 or MW1 becomes low in the active state, the word drive line VMID0 or VMID1 is set to the read-out voltage level. When the main word line signal MW0 or MW1 becomes high in the inactive state, the word drive line VMID0 or VMID1 is set to the ground voltage level, namely, a level at which the memory cell are not activated.

The P-channel transistor 130 and the N-channel transistors 240 and 250 function as the word driver that drives the word line W00 in response to the main word line signal MW0 and the sub-word line signal XP0. The P-channel transistor 140 and the N-channel transistors 260 and 270 function as the word driver that drives the word line W01 in response to the main word line signal MW0 and the sub-word line signal XP1. The P-channel transistor 131 and the N-channel transistors 241 and 251 function as the word driver that drives the word line W10 in response to the main word line signal MW1 and the sub-word line signal XP0. The P-channel transistor 141 and the N-channel transistors 261 and 271 function as the word driver that drives the word line W11 in response to the main word line signal MW1 and the sub-word line signal XP1.

The word drivers supply the voltages on the word drive lines VMID to the word lines W in response to the sub-word line signals XP. In other words, one word driver is selected which is located at a cross point of one selected main word line MW in an active state and one selected sub-word line XP in an active state, so that one word line W is made active. Thus, the row address signal is decoded. When the word line W is made active, memory cells connected to the active word line are made active. Among the active memory cells, data of one of memory cells that is selected based on a column address signal is outputted onto the output bus 18. In FIG. 2, either of the word lines W00, W01, W10, and W11 is selected based on the row address signal on the main word lines MW0 and MW1, and the sub-word-lines XP0 and XP1.

Figure 3:
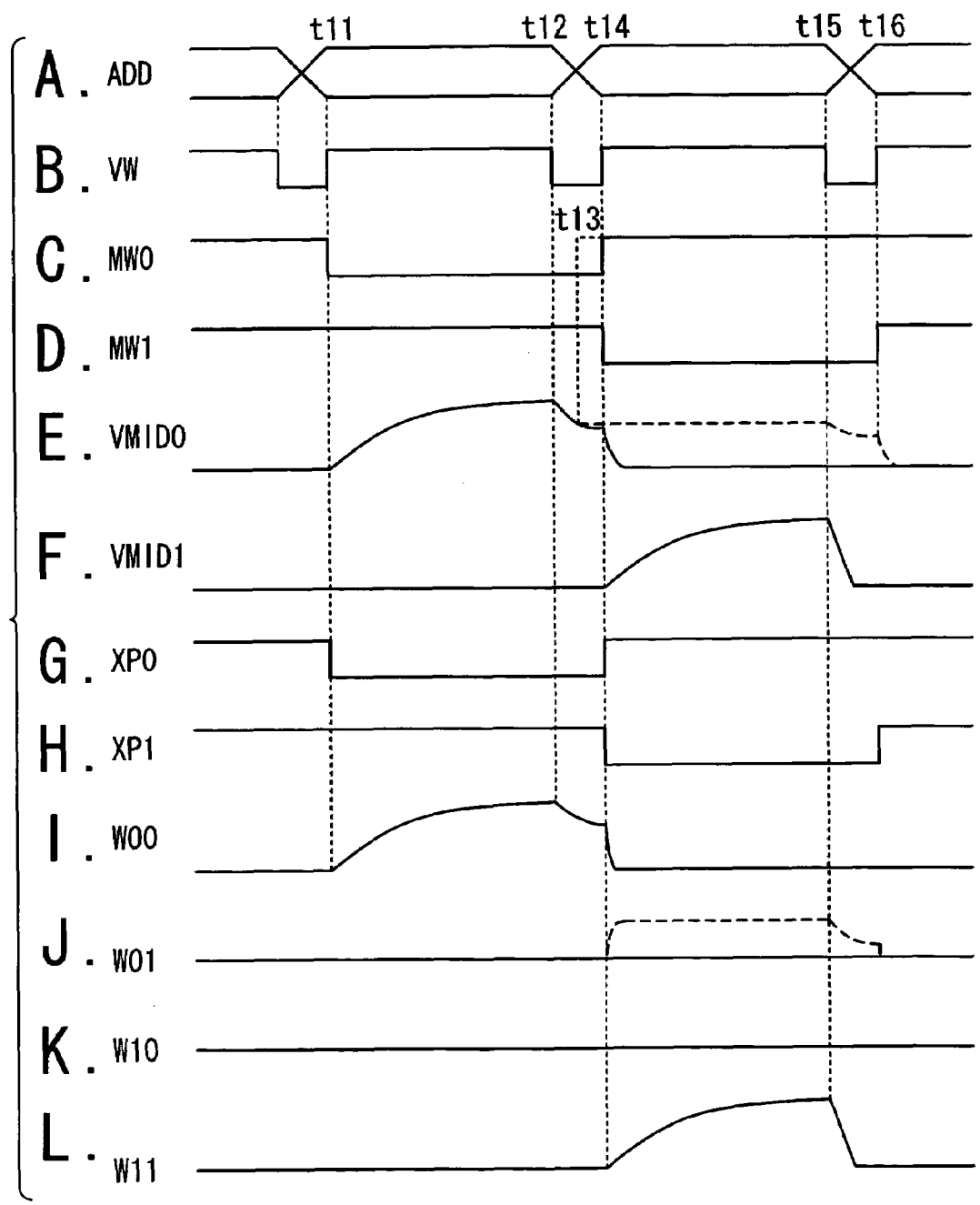
FIGS. 3A to 3L are timing charts showing an operation of the internal decoder section shown in FIG. 2.

Referring now to FIGS. 3A to 3M, a circuit operation of the flash memory 10 will be described. FIG. 3A shows an address signal ADD supplied to the flash memory 10. FIG. 3B shows a change of the power supply voltage VW applied to the main word driver. Namely, FIG. 3B shows that the power supply voltage VW is changed when the address signal ADD shown in FIG. 3A is changed. FIG. 3C shows a signal level of the main word line signal MW0 supplied from the global row decoder section 22. Namely, FIG. 3C shows that the main word line signal MW0 is selected between the timings t11 and t14 and is made active. FIG. 3D shows a signal level of the main word line signal MW1 supplied from the global row decoder section 22. Namely, FIG. 3D shows that the main word line signal MW1 is selected between the timings t14 and t16 and is made active. FIG. 3E shows a voltage change of the word drive line signal VMID0. FIG. 3F shows a voltage change of the word drive line signal VMID1. FIG. 3G shows a signal level of the sub-word line signal XP0 supplied from the local row decoder section 23. Namely, FIG. 3G shows that the sub-word line signal XP0 is selected between the timings t11 and t14 and is made active. FIG. 3H shows a signal level of the sub-word line signal XP1 supplied from the local row decoder section 23. Namely, FIG. 3H shows that the sub-word line signal XP1 is selected between the timings t14 and t16 and is made active. FIG. 3I shows a signal level of the word line signal W00 driven by the word driver. The word line signal W00 is selected and made active based upon signals of both the main word line signal MW0 and the sub-word line signal XP0. FIG. 3J shows a signal level of the word line signal W01 driven by the word driver. The word line signal W01 is selected and made active based upon signals of both the main word line signal MW0 and the sub-word line signal XP1. FIG. 3K shows a signal level of the word line signal W10 driven by the word driver. The word line signal W10 is selected and made active based upon signals of both the main word line signal MW1 and the sub-word line XP0. FIG. 3M shows a signal level of the word line signal W11 driven by the word driver. The word line W11 is selected and made active based upon signals of both the main word line signal MW1 and the sub-word line signal XP1.

In the read operation, it is supposed that the main word line MW0 is selected and made active at the timing t11 when the address signal ADD becomes stable. At this time, the power supply voltage VW to be applied to the main word driver is set to the read-out voltage level, for example, 6 V. When the main word line MW0 is made active, the N-channel transistor 210 is set to an ON state, and the N-channel transistor 220 is set to an OFF state. When the N-channel transistor 210 is set to the ON state, the gate voltage of the P-channel transistor 120 is lowered and the P-channel transistor 120 is set to the ON state. As a consequence, a voltage of the word drive line VMID0 as a voltage of the connection node between the N-channel transistor 220 and the P-channel transistor 120 is increased as shown in FIG. 3E. Also, since a voltage at the gate of the P-channel transistor 110 is also increased, the P-channel transistor 110 is set to an OFF state. Thus, the level shift circuit becomes stable.

On the other hand, as shown in FIG. 3G, since the sub-word line XP0 is selected at the timing t11 and made active, the P-channel transistor 130 is set to an ON state, and the N-channel transistor 240 is set to an OFF state. Since the main word line MW0 has been selected, the N-channel transistor 250 is remained in an OFF state. As a consequence, as shown in FIG. 3I, the word line signal W00 is increased in voltage to the voltage of the word drive line VMID0. At this time, since the sub-word line XP1 is not selected, the P-channel transistor 140 is set to an OFF state and the N-channel transistor 260 is set to an ON state, so that the word line signal W01 is not changed from the ground voltage. Also, since the main word line signal MW1 is not selected, and is in a high voltage level, the N-channel transistors 221, 251, and 271 are set to an ON states. Since the N-channel transistor 221 is in the ON state, a voltage of the word drive line VMID1 is set to the ground voltage. Further, even when the sub-word line XP1 is selected, the voltages of the word line W10 and W11 are not changed from the ground voltage, since both the N-channel transistors 251 and 271 are in the ON state.

When the address signal ADD starts to be changed from the timing t12, an ATD (Address Transition Detector) circuit 12-1 provided in the address buffer section 12 detects this address change, and then notifies the detected address change to the control circuit 15 shown in FIG. 1. The control circuit 15 instructs the power supply switching section 21 to lower the power supply voltage VW from the read-out voltage level to the Vcc voltage level. This is because a ratio of a gate area of the P-channel transistor to that of the N-channel transistor has been adjusted such that a level shift cannot be carried out in case of a voltage higher than a certain voltage. That is, the N-channel transistor 210 cannot drive the P-channel transistors 110 and 120. As a consequence, unless the voltage of the drain of the N-channel transistor 220, namely, the voltage of the word drive line VMID0 have been lowered to the Vcc voltage level of the main word line signal, the N-channel transistor 220 cannot drive the word drive line VMID0 to discharge the electric charge on the word drive line VMID0. In other words, at the timing t14, when the main word line MW0 is set to a high level, the N-channel transistor 220 cannot drive.

As shown by a solid line in FIG. 3E, the voltage of the word drive line VMID0 is lowered to a certain voltage at the timing t14. When the main word line MW0 is set to a non-selection state and made inactive, the N-channel transistor 220 is set to the ON state, and charge on the word drive line VMID0 is discharged so as to set the voltage thereof to the ground voltage. When the voltage of the word drive line VMID0 has been set to the ground voltage, the P-channel transistor 110 is set to the ON state, so that the voltage of the drain thereof is increased. When the drain voltage of the P-channel transistor 110 is increased, namely the gate voltage of the P-channel transistor 120 is increased, the P-channel transistor 120 is set to the OFF state. As a result, this level shift circuit becomes stable.

At the timing t14, when both the main word line MW1 and the sub-word line XP1 are selected and the voltages on them set to the low level, the word line W11 is set to a selection state and made active, similar to the above-described case of the word line W00.

As previously described, a word line connected to a memory, which is designated by an address signal, is selected, so that data stored in this memory is read out. In other words, the word line selection may be carried out by a simple circuit.

A time period during which the power supply voltage VW applied to the level shift circuit is set to the voltage of the Vcc level may be determined by considering a case that an external address transition occurs in a short time interval. Thus, a reset time period may be secured until the voltage of the word line driver becomes equal to or lower than a certain voltage, in which the N-channel transistors 220 and 221 can be operated. If this reset time period has no margin, there is a possibility that the flash memory 10 operates due to skews of signals as shown by broken lines in FIGS. 4E.

The flash memory 10 operates in the above-described manner until the timing t12. It is supposed that the main word line MW0 is set to a non-selection state or made inactive at the timing t13. This timing t13 corresponds to timing that the voltage of the word drive line VMID0 is still high in order that the gate of the N-channel transistor 220 is controlled based upon the Vcc level voltage of the main word line MW0. That is, the main word line MW0 is set to the non-selection state and made inactive before the voltage of the word drive line VMID0 is sufficiently lowered. At this time, it is supposed that the N-channel transistor 220 is set to an ON state, to discharge the word drive line VMID0 to a reset state. However, since the P-channel transistor 120 is still kept in ON state, the voltage of the word drive line VMID0 is not lowered until the P-channel transistor 110 is set to the complete ON state. As a result, since the P-channel transistor 110 is not set to the complete ON state and the gate voltage of the P-channel transistor 120 is not increased, the P-channel transistor 120 is not set to the complete OFF state. In other words, the level shift circuit is set to a balance state at this time. As a result, as shown by the broken line in FIG. 3E, the voltage of the word drive line VMID0 is kept at an intermediate voltage.

At this time, as shown in FIG. 3H, if another sub-word line XP1 is set to a selection state, a low voltage is also applied to the gate of the P-channel transistor 140 and the gate of the N-channel transistor 170. Thus, the P-channel transistor 140 is set to the ON state, and the N-channel transistor 260 is set to the OFF state. As a result, as shown by the broken line in FIG. 3J, the voltage of the word drive line VMID0 appears on the word line W01 via the P-channel transistor 140. The memory cell which should not be originally selected may be activated by this word line W01, so that data stored in this memory cell may be outputted. As a consequence, there is a possibility that an erroneous read operation is carried out.

As previously described, when the size of the circuit is reduced, there is a possibility that an operation failure may occur. Thus, a limitation must be applied to an address input skew by considering the reset time of the voltages at the above-mentioned respective connection nodes.

A time period during which the power supply voltage VW applied to the level shift circuit is set to the voltage of the Vcc level may be determined by considering such a case that an external address transition occurs in a short time interval. In other words, the reset time may be secured such that the N-channel transistors 220 and 221 are not driven until the power supply voltage VW applied to the level shift circuit becomes equal to or lower than a constant voltage. If this reset time has no margin, there is a possibility that the flash memory 10 operates as shown by broken lines in FIG. 3E due to skews of signals. As a consequence, if this reset time is shortened, a next access operation can be made possible in a shorter time. However, as described above, if the reset time is merely shortened, there is a possibility that the operation failure may be caused. Accordingly, an example that a reset circuit is additionally provided to further shorten the reset time will now be described.

Figure 4:
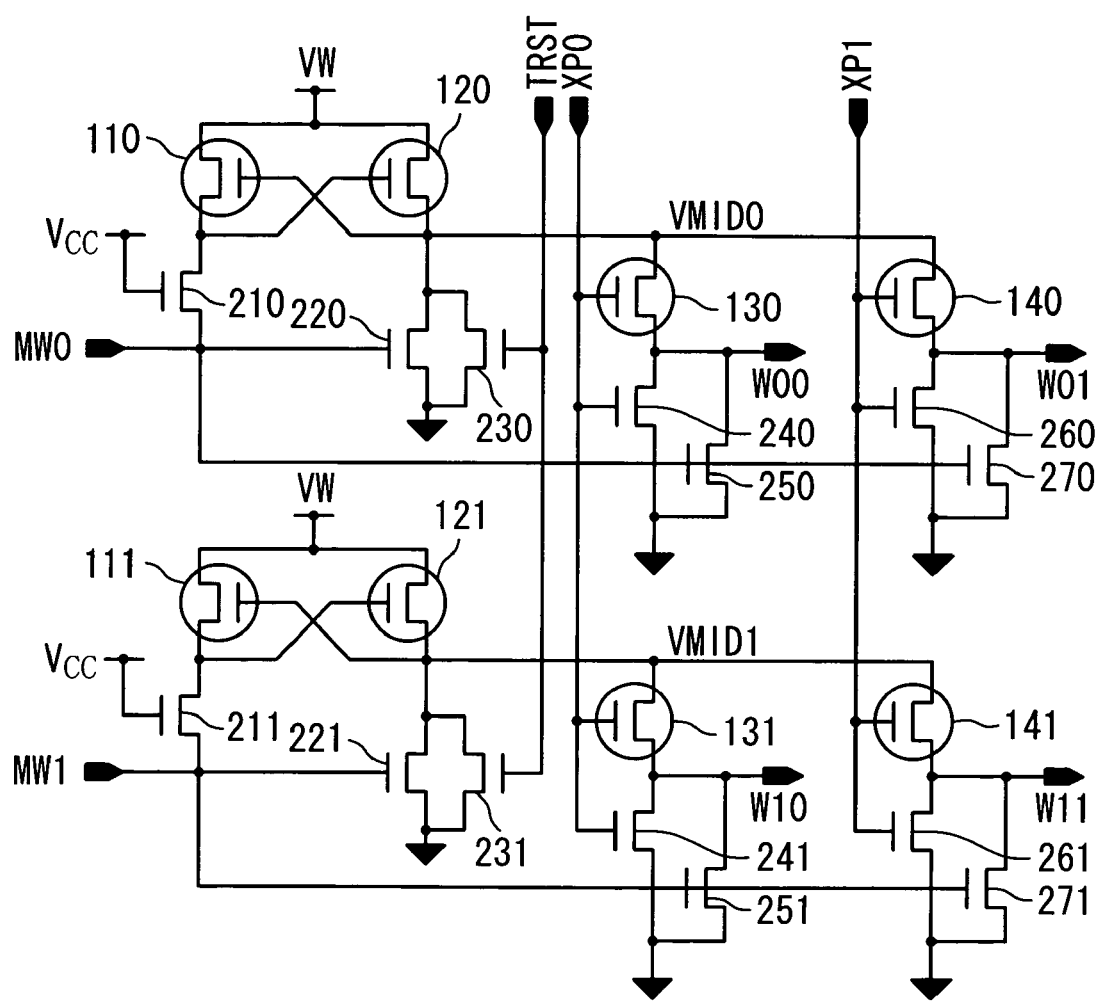
FIG. 4 is a circuit diagram showing a portion of an internal decoder section in the flash memory according to an embodiment of the present invention.

FIG. 4 is a circuit diagram showing a decoder section portion in which a word line, such as one of the word lines W00, W01, W10, and W11, is selected based on both a main word line signal, such as one of the main word line signals MW0 and MW1 outputted from the global row decoder section 22, and a sub-word line signal, such as one of the sub-word line signals XP0 and XP1 outputted from the local row decoder section 23. Two sets of the main word lines and two sets of the sub-word lines in this decoder section portion are shown in FIG. 4. In comparison with the decoder section portion of FIG. 2, N-channel transistors 230 and 231 are added in parallel to the N-channel transistors 220 and 221, respectively, and they are controlled based on a signal TRST. When detecting transition of the address signal, an address transition detector 12-1 of the address buffer section 12 notifies the detection to the control circuit 15. The control circuit 15 generates an active reset control signal TRST and outputs it to the boosting circuit 14 and the decoder section 22, 23 and 24. Thus, the main word signal and the sub-word signal are activated during a period that the reset control signal is inactive. Also, the boosting circuit 14 outputs to the power supply switching circuit 21, the boosted voltage in which the voltage level is lowered to the ground voltage during the period that the reset control signal is active.

Figure 5:
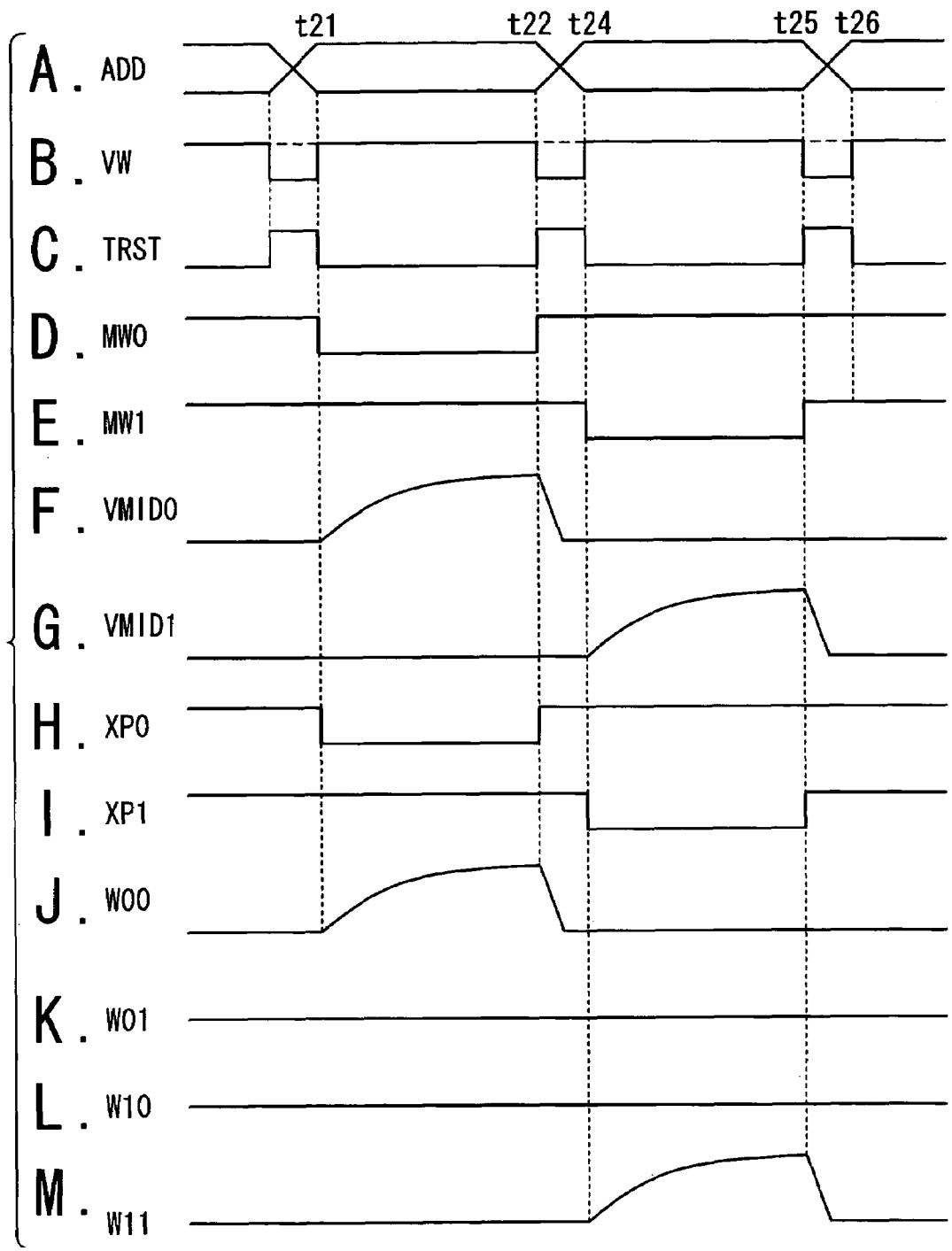
FIGS. 5A to 5M are timing charts showing an operation of the internal decoder section shown in FIG. 4.

Referring now to FIGS. 5A to 5M, a circuit operation of the flash memory 10 will be described. FIG. 5A shows an address signal ADD supplied to the flash memory 10. That is, FIG. 5A shows that the address signal ADD is changed at a timing t21, a timing t22, and a timing t25. FIG. 5B shows the power supply voltage VW applied to the main word driver. Namely, FIG. 5B shows that the power supply voltage VW is changed when the address signal ADD shown in FIG. 5A is changed. FIG. 5C shows a reset signal TRST for the word drive line VMID. Similar to the power supply VW, the signal TRST also shows that the power supply voltage VW is changed when the address signal ADD is changed. As a consequence, the signal TRST resets the voltages of the word drive lines VMID0 and VMID1 every time the address is changed. The signal TRST may be further made active, in synchronism with a chip enable signal of an enable state, or a power ON reset operation when a power supply is turned ON. FIG. 5D shows a signal level of the main word signal MW0 supplied from the global row decoder section 22. Namely, FIG. 5D shows that the main word line MW0 is selected between the timings t21 to t22 and made active. FIG. 5E shows a signal level of the main word signal MW1 supplied from the global row decoder section 22. Namely, FIG. 5E shows that the main word line MW1 is selected between the timings t24 to t25 and made active. FIG. 5F shows a voltage change of the word drive line VMID0. FIG. 5G shows a voltage change on the word drive line VMID1. FIG. 5H shows a signal level of the sub-word signal XP0 supplied from the local row decoder section 23. Namely, FIG. 5H shows that the sub-word line XP0 is selected between the timings t21 to t22 and made active. FIG. 5I shows a signal level of the sub-word signal XP1 supplied from the local row decoder section 23. Namely, FIG. 5I shows that the sub-word line XP1 is selected between the timings t24 to t25 and made active. FIG. 5J shows a signal level of the word signal W00 driven by the word driver. The word line W00 is selected and made active based upon both of the main word signal MW0 and the sub-word signal XP0. FIG. 5K shows a signal level of the word signal W01 driven by the word driver. The word line W01 is selected and made active based upon both of the main word signal MW0 and the sub-word signal XP1. FIG. 5I shows a signal level of the word signal W10 driven by the word driver. The word line W10 is selected and made active based upon both of the main word signal MW1 and the sub-word signal XP0. FIG. 5M shows a signal level of the word signal W11 driven by the word driver. The word line W11 is selected and made active based upon both of the main word signal MW1 and the sub-word signal XP1.

The circuit operation of the flash memory 10 will now be described. When the address signal ADD becomes stable at the timing t21, the signal TRST is set to an inactive low level, so that the N-channel transistors 230 and 231 are set to the OFF states. Also, the main word line MW0 is selected and made active. At this time, the power supply voltage VW applied to the main word driver becomes the read-out voltage level, for example, 6 V. When the main word line MW0 is made active, the N-channel transistor 210 is set to the ON state, and the N-channel transistor 220 is set to the OFF state. When the N-channel transistor 210 is set to the ON state, the gate voltage of the P-channel transistor 120 is lowered and the P-channel transistor 120 is set to the ON state. As a consequence, a voltage of the word drive line VMID0 is increased to a voltage at a connection node between the drain of the N-channel transistor 200 and the drain of the P-channel transistor 120 as shown in FIG. 5F. Also, since a voltage at the gate of the P-channel transistor 110 is also increased, the P-channel transistor 110 is set to the OFF state, and the level shift circuit becomes stable.

On the other hand, since the sub-word line XP0 is selected at the timing t21 and made active, the P-channel transistor 130 is set to the ON state, and the N-channel transistor 240 is set to the OFF state. Since the main word line MW0 has been selected, the N-channel transistor 250 is in the OFF state. As a consequence, the voltage of the word line W00 is increased to the voltage of the word drive line VMID0. At the time, since the sub-word line XP1 is not selected, the P-channel transistor 140 is set to the OFF state and the N-channel transistor 260 is set to the ON state, so that the voltage of the word line W01 is not changed from the ground voltage. Also, since the main word line MW1 is not selected, and is at a high voltage level, the N-channel transistors 221, 251, and 271 are set to the ON states. Since the N-channel transistor 221 is in the ON state, a voltage at the word drive line VMID1 is set to the ground voltage. Further, even when the sub-word line XP1 is selected, the voltages at the word line W10 and W11 are not changed from the ground voltage, since both the N-channel transistors 251 and 271 are in the ON states.

When the address signal ADD is changed during a time period from the timing t22 to the timing t24, the ATD (Address Transition Detector) circuit 12-1 detects the address transition, and notifies the detected address transition to the control circuit 15 shown in FIG. 1. The control circuit 15 generates a reset control signal TRST of an active state in response to the detection of the address transition and instructs the voltage switching circuit 21 to lower the power supply voltage VW from the read-out voltage level to the Vcc voltage level, as shown in FIG. 5B. Also, the N-channel transistors 230 and 231 are set to the ON states so as to reset the voltages of the word drive lines VMID0 and VMID1. Also, the signal TRST is supplied decoder sections 22, 23 and 24 to control the main word signal, the sub-word signal, and the bit signal.

As shown in FIG. 5F, the word reset line VMID0 is reset at the timing t24, and thus, becomes substantially equal to the ground voltage. When the main word line MW0 becomes a non-selection state (inactive), the N-channel transistor 220 is set to an ON state, so that the word drive line VMID0 can be firmly set to the ground voltage. When the voltage of the word drive line VMID0 becomes the ground voltage, the P-channel transistor 110 is set to an ON state, so that the voltage of the drain thereof is increased. When the drain voltage of the P-channel transistor 110 is increased, namely the gate voltage of the P-channel transistor 120 is increased, the P-channel transistor 120 is set to an OFF state, so that the level shift circuit becomes stable.

At the timing t24, when both the main word line MW1 and the sub-word line XP1 are selected and the voltages are lowered, the word line W11 is set to a selection state (active) similar to the above-described case of the word line W00.

As previously explained, a word line connected to a memory, which is designated by an address, is selected, so that data stored in the memory is read out. In other words, a word line selection may be made by a simple circuit arrangement.

In this case, the N-channel transistors 230 and 231 need not be arranged in the vicinity of the N-channel transistors 220 and 221, but may be freely arranged. As a result, stronger driving capability may also be applied. Also, the signal TRST is a signal having an opposite phase with respect to that of the power supply VW, is controlled at the same timing as that of a pre-decode circuit, and the signal level thereof is equal thereto. The power supply VW of the level shift circuit needs not be controlled, and as shown by a broken line in FIG. 5B, the power supply VW of the level shift circuit may become constant.

As previously described, in the row decoder section having the hierarchical decode function, the high voltage drive discharging-purpose N-channel transistor is provided, which forcibly resets the level shift circuit within the row decoder section. As a result, the high-speed data reading operation can be carried out, and the skew restriction can be relaxed. In other words, the decoder section circuit can be initialized by using only necessary minimum number of reset pulses, so that the high-speed accessing operation can be carried out, and the skew restriction can be relaxed. Also, since only one additional transistor and only one control line may be provided, the increase of the area may be suppressed.

According to the present invention, such a semiconductor memory device capable of realizing the high-speed access operation can be provided. Also, in accordance with the present invention, a semiconductor memory device capable of relaxing the skew restrictions of the addresses can be provided. Moreover, according to the present invention, a semiconductor memory device capable of suppressing the increase of the semiconductor chip area can be provided.

What is claimed is:

1. A semiconductor memory device, comprising:
   an address buffer section for outputting an address signal;
   a word drive line;
   a word line connected with memory cells;
   a first drive circuit configured to drive said word drive line to a first voltage based on a main word signal, and to reset said word drive line from the first voltage to a ground voltage within a time period for a transition of the address signal output from the address buffer section when the word drive line is at the first voltage; and
   a second drive circuit configured to output a signal of said first voltage to said word line based on a sub-word signal such that a data is read out from one of said memory cells;
   wherein said main word signal and said sub-word signal are obtained from the address signal, and are signals that are variable among the ground voltage and a second voltage that is lower than said first voltage.

2. A semiconductor memory device, comprising:
   a word drive line;
   a word line connected with memory cells;
   a first drive circuit configured to drive said word drive line to a first voltage based on a main word signal, and to reset said word drive line from the first voltage to a ground voltage in a time period for a transition of an address signal;
   a second drive circuit configured to output a signal of said first voltage to said word line based on a sub-word signal such that a data is read out from one of said memory cells;
   an address transition detector configured to detect the transition of said address signal; and
   a control circuit configured to generate a reset control signal that is active during the time period for the transition of said address signal;
   wherein said main word signal and said sub-word signal are obtained from the address signal, and are signals that are variable among the ground voltage and a second voltage that is lower than said first voltage; and
   wherein said first drive circuit is configured to reset said word drive line from the first voltage to the ground voltage in response to said reset control signal being active when the word drive line is at the first voltage.

3. The semiconductor memory device according to claim 2, wherein said second drive circuit comprises:
   a P-channel transistor having a source connected with said word drive line, and a gate connected to said sub-word signal;
   a first N-channel transistor having a drain connected with a drain of said P-channel transistor, a gate connected to said sub-word signal, and a source connected to the ground voltage; and
   a second N-channel transistor having a drain connected with the drain of said P-channel transistor, a gate connected to said main word signal, and a source connected to the ground voltage.

4. The semiconductor memory device according to claim 2, wherein said first drive circuit comprises:
   a level shift circuit configured to invert and level-shift said main word signal to output said first voltage signal onto said word drive line; and a reset circuit connected in parallel to said level shift circuit to reset said word drive line to the ground voltage in response to said reset control signal being active.

5. The semiconductor memory device according to claim 4,
wherein said level shift circuit comprises:
a first P-channel transistor having a source connected with said first voltage, a gate connected with said word drive line, and a drain;
a second P-channel transistor having a source connected with said first voltage, a gate connected to the drain of said first P-channel transistor, and a drain connected with said word drive line and the gate of said first P-channel transistor;
a first N-channel transistor having a drain connected with the drain of said first P-channel transistor, a gate connected with said second voltage, and a source connected with said main word signal; and
a second N-channel transistor having a drain connected with the drain of said second P-channel transistor, a gate connected with said main word signal, and a source connected with said ground voltage; and
wherein said reset circuit comprises:
a N-channel reset transistor having a drain connected with said word drive line, a gate connected with said reset control signal, and a source connected to the ground voltage.

6. The semiconductor memory device according to claim 2, further comprising:
a global row decoder configured to decode a part of said address signal to generate said main word signal while said reset control signal is inactive; and
a local row decoder configured to decode another part of said address signal to generate said sub-word signal while said reset control signal is inactive.

7. The semiconductor memory device according to claim 2, further comprising:
a boosting circuit configured to boost said second voltage to said first voltage while said reset control signal is inactive.

8. The semiconductor memory device according to claim 2, further comprising:
a boosting circuit configured to boost said second voltage to said first voltage.

9. A method of reading a data from a memory cell in a semiconductor memory device, comprising:
providing an address signal from an address buffer section;
activating a main word signal based on the address signal;
activating a sub-word signal based on the address signal;
driving a word drive line to a first voltage based on the main word signal;
outputting a signal of said first voltage to a word line based on the sub-word signal such that the data is read out from said memory cell; and
resetting said word drive line from the first voltage to a ground voltage within a time period for a transition of the address signal provided by the address buffer section when the word drive line is at the first voltage; and
wherein said main word signal and said sub-word signal are signals that are variable among the ground voltage and a second voltage tat is lower than said first voltage.

10. A method of reading a data from a memory cell in a semiconductor memory device, comprising:
activating a main word signal;
activating a sub-word signal;
driving a word drive line to a first voltage based on the activated main word signal;
outputting a signal of said first voltage to a word line based on the activated sub-word signal such that the data is read out from said memory cell;
detecting a transition of an address signal;
generating a reset control signal that is active during a time period for the transition of said address signal; and
resetting said word drive line from the first voltage to a ground voltage in the time period for the transition of the address signal;
wherein said main word signal and said sub-word signal are obtained from the address signal, and are signals that are variable among the ground voltage and a second voltage that is lower than said first voltage; and
wherein said resetting comprises:
resetting said word drive line from the first voltage to the ground voltage in response to said reset control signal being active when the word drive line is at the first voltage.

11. The method according to claim 10, wherein said driving comprises:
inverting and level-shifting said activated main word signal to output said first voltage signal onto said word drive line.

12. The method according to claim 10, further comprising:
decoding a part of said address signal to generate said main word signal while said reset control signal is inactive; and
decoding another part of said address signal to generate said sub-word signal while said reset control signal is inactive.

13. The method according to claim 10, further comprising:
boosting said second voltage to said first voltage while said reset control signal is inactive.

14. The method according to claim 10, further comprising:
boosting said second voltage to said first voltage.

15. A method of reading a data from a memory cell in a semiconductor memory device, comprising:
activating a main word signal;
activating a sub-word signal;
driving a word drive line to a first voltage based on the activated main word signal;
outputting a signal of said first voltage to a word line based on the activated sub-word signal such that the data is read out from said memory cell;
detecting a transition of an address signal;
generating a reset control signal that is active during a time period for the transition of said address signal; and
resetting said word drive line to a ground voltage in the time period for the transition of the address signal;
wherein said main word signal and said sub-word signal are obtained from the address signal, and are signals that are variable among the ground voltage and a second voltage that is lower than said first voltage; and
wherein said resetting comprises:
resetting said word drive line to the ground voltage in response to said reset control signal being active by applying said reset control signal to a gate of a N-channel reset transistor.

16. A semiconductor memory device, comprising:
a word drive line;
a word drive circuit having a first P-channel transistor and a first N-channel transistor and configured to output a first voltage and a second voltage onto said word drive line;
a first control circuit connected between a gate of said first P-channel transistor and a gate of said first N-channel transistor and configured to receive a main word signal; and
a second control circuit configured to control said gate of said first P-channel transistor in response to an output of said word drive circuit;
wherein said word drive line is connected with at least one sub-word drive circuit to which a sub-word signal is supplied;
wherein said at least one sub-word drive circuit comprises:
a second P-channel transistor;
a second N-channel transistor; and
a third N-channel transistor;
wherein said second P-channel transistor has a source connected with said word drive line, a gate supplied with said sub-word signal, and a drain connected with a word line;
wherein said second N-channel transistor has a source connected with a ground potential, a gate supplied with said sub-word signal, and a drain connected with said word line; and
wherein said third N-channel transistor has a source connected with the ground potential, a gate supplied with said main word signal, and a drain connected with said word line.

17. A semiconductor memory device, comprising:
a word drive line;
a word line;
a first drive circuit configured to drive the word drive line to a first voltage in response to a main word signal being activated, and configured to reset the word drive line from the first voltage to a ground voltage when there is a transition of an address signal and the word drive line is at the first voltage, said main word signal obtained from said address signal and variable among the ground voltage and a second voltage that is lower than the first voltage;
a second drive circuit configured to output a signal of the first voltage to the word line based on a sub-word signal;
an address transition detector circuit for detecting the transition of the address signal;
a power supply switching section for controllably switching a voltage supplied to the first drive circuit between the first voltage and the second voltage; and
a control circuit for controlling the power supply switching section to switch from supplying the first drive circuit with the first voltage to supplying the first drive circuit with the second voltage when the address transition detector circuit detects the transition of the address signal.

18. A method in a semiconductor memory device, the method comprising:
activating a main word signal based on an address signal;
activating a sub-word signal based on the address signal;
driving, by a drive circuit, a word drive line to a first voltage when the main word signal is activated, said main word signal variable among a ground voltage and a second voltage that is lower than the first voltage;
outputting a signal of the first voltage to a word line when the sub-word signal is activated and the word drive line has been driven to the first voltage;
detecting a transition of the address signal;
changing a voltage supplied to the drive circuit from the first voltage to the second voltage when the transition of the address signal is detected; and
supplying the main word signal to a gate of a N-channel transistor, said N-channel transistor having a drain connected with the word drive line and a source connected with the ground voltage.

* * * * *